United States Patent
Song et al.

(10) Patent No.: US 11,404,515 B2
(45) Date of Patent: Aug. 2, 2022

(54) DISPLAY SUBSTRATE AND MANUFACTURING METHOD THEREOF, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Wei Song, Beijing (CN); Ce Zhao, Beijing (CN); Yuankui Ding, Beijing (CN); Heekyu Kim, Beijing (CN); Ming Wang, Beijing (CN); Ning Liu, Beijing (CN); Yingbin Hu, Beijing (CN)

(73) Assignees: HEFEI XINSHENG OPTOELECTRONICS TECHNOLOGY CO., LTD., Anhui (CN); BOE TECHNOLOGY GROUP CO., LTD.., Beijing (CN)

( * ) Notice: Subject to any disclaimer, the term of this patent is extended or adjusted under 35 U.S.C. 154(b) by 24 days.

(21) Appl. No.: 16/959,114

(22) PCT Filed: Feb. 26, 2020

(86) PCT No.: PCT/CN2020/076811
§ 371 (c)(1),
(2) Date: Jun. 29, 2020

(87) PCT Pub. No.: WO2020/192345
PCT Pub. Date: Oct. 1, 2020

(65) Prior Publication Data
US 2021/0257428 A1    Aug. 19, 2021

(30) Foreign Application Priority Data
Mar. 27, 2019 (CN) .......................... 201910237989.0

(51) Int. Cl.
*H01L 27/32* (2006.01)
*H01L 51/56* (2006.01)
(Continued)

(52) U.S. Cl.
CPC ...... *H01L 27/3262* (2013.01); *H01L 27/3248* (2013.01); *H01L 27/3258* (2013.01);
(Continued)

(58) Field of Classification Search
CPC ............... H01L 27/3262; H01L 27/326; H01L 27/3258; H01L 51/5209
See application file for complete search history.

(56) References Cited

U.S. PATENT DOCUMENTS 6,853,083 B1 * 2/2005 Yamauchi ............ G09G 3/3233
257/347
6,921,918 B2 * 7/2005 Park .................. H01L 29/78675
257/72

(Continued)

FOREIGN PATENT DOCUMENTS

| CN | 101325209 A | 12/2008 |
|---|---|---|
| CN | 106847857 A | 6/2017 |
| CN | 109904210 A | 6/2019 |

OTHER PUBLICATIONS

ISA China National Intellectual Property Administration, International Search Report Issued in Application No. PCT/CN2020/076811, dated May 6, 2020, WIPO, 16 pages. (Submitted with Partial Translation).

(Continued)

*Primary Examiner* — Victoria K. Hall
(74) *Attorney, Agent, or Firm* — McCoy Russell LLP

(57) ABSTRACT

A display substrate and a manufacturing method thereof, and a display device, are disclosed. The display substrate includes a base substrate and a thin film transistor (TFT)

(Continued)

array, including a plurality of TFTs. A first electrode in each TFT includes a first portion and a second portion, a height of the second portion being greater than a height of the first portion in a direction perpendicular to the base substrate, wherein the first portion forms a groove with respect to the second portion and a wall of the groove comprises the second portion of the first electrode of a thin film transistor adjacent to the TFT. A bottom of the groove is the first pixel electrode of a light emitting element, wherein an organic light emitting functional layer is deposited in the groove on the first pixel electrode, and the second pixel electrode on the organic light emitting functional layer.

18 Claims, 9 Drawing Sheets

(51) Int. Cl.
  *H01L 29/417* (2006.01)
  *H01L 27/12* (2006.01)
(52) U.S. Cl.
  CPC ........ *H01L 29/41733* (2013.01); *H01L 51/56* (2013.01); *H01L 27/1214* (2013.01); *H01L 2227/323* (2013.01)

(56) References Cited

U.S. PATENT DOCUMENTS

| | | | | |
|---|---|---|---|---|
| 7,205,716 | B2* | 4/2007 | Yamazaki | H01L 27/3244 |
| | | | | 313/504 |
| 7,830,080 | B2* | 11/2010 | Tanada | G09G 3/3258 |
| | | | | 313/500 |
| 8,445,915 | B2* | 5/2013 | You | H01L 27/3248 |
| | | | | 257/72 |
| 9,178,003 | B2* | 11/2015 | Park | H01L 51/5271 |
| 9,564,612 | B2* | 2/2017 | Park | H01L 51/5271 |
| 10,109,655 | B2* | 10/2018 | Lee | H01L 29/41733 |
| 2004/0113550 | A1* | 6/2004 | Adachi | H01L 51/5262 |
| | | | | 313/512 |
| 2005/0116630 | A1* | 6/2005 | Kim | H01L 27/1244 |
| | | | | 313/506 |
| 2005/0145861 | A1* | 7/2005 | Kawakami | H01L 27/12 |
| | | | | 257/88 |
| 2005/0161680 | A1* | 7/2005 | Kawakami | H01L 51/5262 |
| | | | | 257/79 |
| 2005/0179372 | A1* | 8/2005 | Kawakami | H01L 27/3258 |
| | | | | 313/506 |
| 2006/0012742 | A1* | 1/2006 | Tsai | H01L 27/3248 |
| | | | | 349/139 |
| 2008/0197342 | A1* | 8/2008 | Lee | H01L 51/56 |
| | | | | 257/40 |
| 2008/0308810 | A1 | 12/2008 | Akimoto | |
| 2009/0051275 | A1 | 2/2009 | Kobayashi et al. | |
| 2009/0140283 | A1* | 6/2009 | Kawakami | H01L 27/12 |
| | | | | 257/99 |
| 2012/0074412 | A1* | 3/2012 | Kim | H01L 27/3265 |
| | | | | 257/59 |
| 2014/0139102 | A1* | 5/2014 | Jeon | H01L 27/326 |
| | | | | 313/504 |
| 2016/0035756 | A1* | 2/2016 | Jiang | H01L 27/1288 |
| | | | | 257/43 |
| 2016/0056220 | A1 | 2/2016 | Kang | |
| 2016/0336529 | A1* | 11/2016 | Yamazaki | H01L 27/322 |
| 2016/0365459 | A1 | 12/2016 | Hong et al. | |
| 2017/0141169 | A1 | 5/2017 | Sim et al. | |
| 2017/0186826 | A1* | 6/2017 | Nam | H01L 27/1255 |
| 2017/0278920 | A1* | 9/2017 | Park | H01L 27/3258 |
| 2017/0301860 | A1* | 10/2017 | Yamazaki | H01L 27/3276 |
| 2018/0097053 | A1* | 4/2018 | Park | H01L 27/3262 |
| 2018/0182836 | A1* | 6/2018 | Beak | H01L 27/3265 |
| 2019/0006451 | A1* | 1/2019 | Tanaka | H01L 29/42384 |
| 2019/0041915 | A1* | 2/2019 | Park | H01L 27/124 |
| 2019/0115403 | A1* | 4/2019 | Kang | H01L 51/56 |
| 2019/0131377 | A1* | 5/2019 | Kwon | H01L 51/56 |
| 2019/0172884 | A1* | 6/2019 | Shim | H01L 27/3272 |
| 2019/0214445 | A1* | 7/2019 | Yu | H01L 27/1225 |
| 2019/0288045 | A1* | 9/2019 | Bai | H01L 27/1255 |
| 2019/0355763 | A1* | 11/2019 | Chen | H01L 27/322 |
| 2020/0091264 | A1* | 3/2020 | Lee | H01L 27/3272 |
| 2020/0135772 | A1* | 4/2020 | Lee | H01L 27/1225 |
| 2020/0212131 | A1* | 7/2020 | Kim | H01L 27/3223 |
| 2020/0335566 | A1* | 10/2020 | Yu | H01L 27/3262 |
| 2020/0388661 | A1* | 12/2020 | Kishimoto | H01L 27/3248 |

OTHER PUBLICATIONS

State Intellectual Property Office of the People's Republic of China, Office Action and Search Report Issued in Application No. 201910237989.0, dated Aug. 12, 2020, 14 pages. (Submitted with Partial Translation).

* cited by examiner

DISPLAY SUBSTRATE AND MANUFACTURING METHOD THEREOF, AND DISPLAY DEVICE

CROSS-REFERENCE TO RELATED APPLICATIONS

The present application is a U.S. national phase application of International Application No. PCT/CN2020/076811 filed on Feb. 26, 2020, which claims the priority of Chinese Patent Application No. 201910237989.0 filed on Mar. 27, 2019. The entire contents of each of the above-listed applications are hereby incorporated by reference for all purposes.

TECHNICAL FIELD

The present disclosure relates to the field of display technology, and in particular to a display substrate and a manufacturing method thereof, and a display device.

BACKGROUND AND SUMMARY

With the continuous development of display technology, Organic Light-Emitting Diode (hereinafter referred to as OLED) display devices have gradually attracted people's attention due to their advantages such as self-luminescence, wide viewing angle, and high contrast. The structure of an OLED display device mainly includes: a base substrate, a thin film transistor array formed on the base substrate, and light emitting units formed on the thin film transistor array; the light emitting units correspond to the pixel units included in the OLED display device in one-to-one correspondence, and a light emitting layer included in each light emitting unit is generally realized by inkjet printing technology, therefore, in order to enable the light emitting layer to be accurately formed at the corresponding position, in the related art, a pixel definition layer is generally prepared on the thin-film transistor array. The pixel definition layer defines pixel opening regions corresponding to the pixel units in one-to-one correspondence, so that ink droplets used to form the light emitting layers in the light emitting units can be dropped into the pixel opening regions stably and accurately by inkjet printing technology in the manufacture of the light emitting units.

However, the above pixel definition layer needs to go through processes such as coating, exposure, development, and curing during manufacturing. Such manufacturing process is complicated, and the organic materials used are likely to cause pollution to the environment.

The present disclosure provides the technical solutions as follows:

A first aspect of the present disclosure provides a display substrate including:

a base substrate, a thin film transistor array provided on the base substrate, the thin film transistor array including a plurality of thin film transistors, each thin film transistor including a first electrode and a second electrode, wherein the first electrode includes a first portion and a second portion having a height difference therebetween, and wherein a height of the second portion is greater than a height of the first portion in a direction perpendicular to the base substrate.

Optionally, each of the thin film transistor further includes a first insulation pattern provided between the second portion of the first electrode and the second electrode, an orthographic projection of the first insulation pattern on the base substrate is located between an orthographic projection of the second electrode on the base substrate and an orthographic projection of the second portion of the first electrode on the base substrate.

Optionally, the thin film transistor array is provided with a plurality of grooves for providing light emitting units, the first portion of the first electrode of each thin film transistor is located at the bottom of a groove, and a wall of the groove includes the second portion of the first electrode of this thin film transistor.

Optionally, the wall of the groove further includes the second portion of the first electrode of a thin film transistor adjacent to the thin film transistor.

Optionally, a plurality of grooves for providing light emitting units are defined on a side of the thin film transistor array away from the base station, wherein the first portion of the first electrode of each thin film transistor constitutes a bottom of a groove, and a wall of the groove is constituted by the second portion of the first electrode of this thin film transistor.

Optionally, a plurality of grooves for providing light emitting units are defined on a side of the thin film transistor array away from the base station, wherein the first portion of the first electrode of each thin film transistor constitutes a bottom of a groove, and a wall of the groove includes the second portion of the first electrode of a thin film transistor adjacent to this thin film transistor.

Optionally, the display substrate further includes:

an insulation film layer provided on a side of the thin film transistor array away from the base substrate, the insulation film layer including a plurality of openings corresponding to the plurality of grooves in one-to-one correspondence, each opening exposing the bottom of a corresponding groove;

a plurality of light emitting units provided in the grooves in one-to-one correspondence, each light emitting unit being in contact with the bottom of a corresponding groove.

Optionally, the groove corresponds to one thin film transistor, and the thin film transistor further includes:

an active layer on a side of the second electrode away from the base substrate, the active layer being in contact with the second electrode, the first insulation pattern and the second portion of the first electrode, respectively, an orthographic projection of the active layer on the base substrate surrounding an orthographic projection of the first portion of the first electrode on the base substrate;

a second insulation pattern provided on a side of the active layer away from the base substrate, an orthographic projection of the second insulation pattern on the base substrate surrounding the orthographic projection of the first portion of the first electrode on the base substrate;

a gate provided on a side of the second insulation pattern away from the base substrate, an orthographic projection of the gate on the base substrate being located within the orthographic projection of the second insulation pattern on the base substrate, and surrounding the orthographic projection of the first portion of the first electrode on the base substrate.

Optionally, the display substrate further includes: an insulation film layer provided on a side of the thin film transistor array away from the base substrate, the insulation film layer covering the second portion of the first electrode, the active layer, the second insulation pattern and the gate, and the insulation film layer including a plurality of openings corresponding to the plurality of grooves in one-to-one correspondence, each opening exposing the bottom of a corresponding groove.

Optionally, each groove corresponds to two thin film transistors, and each thin film transistor further includes:

an active layer on a side of the second electrode away from the base substrate, the active layer being in contact with the second electrode, the first insulation pattern and the second portion of the first electrode, respectively;

a second insulation pattern provided on a side of the active layer away from the base substrate;

a gate provided on a side of the second insulation pattern away from the base substrate, an orthographic projection of the gate on the base substrate being located within an orthographic projection of the second insulation pattern on the base substrate.

Optionally, the gates of the two thin film transistors are connected with each other, the second electrodes of the two thin film transistors are connected with each other, and the first electrodes of the two thin film transistors are connected with each other.

Optionally, a height of the second electrode is equal to the height of the second portion of the first electrode in the direction perpendicular to the base substrate; and/or, a height of the first insulation pattern is equal to the height of the second portion of the first electrode in the direction perpendicular to the base substrate.

Optionally, one of the first and second electrodes of the thin film transistor is a source, and the other is a drain.

Based on the above technical solution of display substrate, a second aspect of the present disclosure provides a display device including the above display substrate.

Based on the above technical solution of display substrate, a third aspect of the present disclosure provides a manufacturing method of a display substrate including:

providing a base substrate;

manufacturing a thin film transistor array on the base substrate, the thin film transistor array including a plurality of thin film transistors, each of which including a first electrode and a second electrode, wherein the first electrode includes a first portion and a second portion having a height difference therebetween, and wherein a height of the second portion is greater than a height of the first portion in a direction perpendicular to the base substrate.

Optionally, the manufacturing method further includes:

manufacturing an insulation film layer on a side of the thin film transistor array away from the base substrate, the insulation film layer including a plurality of openings corresponding to the plurality of grooves in one-to-one correspondence, each opening exposing the bottom of a corresponding groove;

manufacturing a plurality of light emitting units in the grooves, the light emitting units corresponding to the grooves in one-to-one correspondence, each light emitting unit being in contact with the bottom of a corresponding groove.

Optionally, the insulation film layer includes an inorganic layer, the light emitting unit includes a first pixel electrode and a second pixel electrode opposite to each other, and an organic light emitting functional layer provided between the first pixel electrode and the second pixel electrode, and an bottom of the groove is also used as the first pixel electrode of a corresponding light emitting unit;

the step of manufacturing the light emitting unit includes:

printing organic solution in the groove by inkjet printing technology to form the organic light emitting functional layer;

forming the second pixel electrode on a side of the organic light emitting functional layer away from the bottom of the groove.

Optionally, the step of manufacturing the second electrode and the first electrode in the thin film transistor includes:

manufacturing the second electrode and the first electrode by a single patterning process, a height of the second electrode being equal to a height of the second portion of the first electrode in the direction perpendicular to the base substrate.

BRIEF DESCRIPTION OF THE DRAWINGS

The drawings being a part of the present disclosure are described herein to provide a further understanding of the present disclosure. The exemplary embodiments of the present disclosure and the descriptions thereof are intended to explain the present disclosure, but not meant to form an inappropriate limitation on the present disclosure. In the drawings.

Figure 1A:
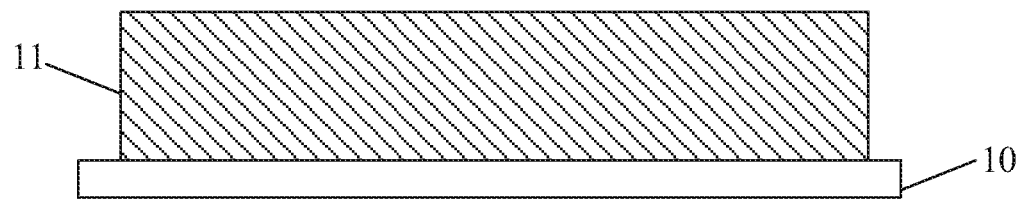
FIG. 1a to FIG. 1g are cross sectional diagrams of grooves in a first and third modes according to embodiments of the present disclosure.

| Reference numerals: | |
| --- | --- |
| 10 - base substrate, | 11 - conductive film, |
| 12 - second electrode, | 13 - first electrode, |
| 131 - first portion, | 132 - second portion, |
| 14 - first insulation pattern, | 15 - active layer, |
| 16 - second insulation pattern, | 17 - gate, |
| 18 - insulation film layer. | |

DETAILED DESCRIPTION

The display substrate and the manufacturing method thereof, and the display device provided by the embodiments of the present disclosure will be described in detail below in conjunction with the drawings.

Figure 1B:
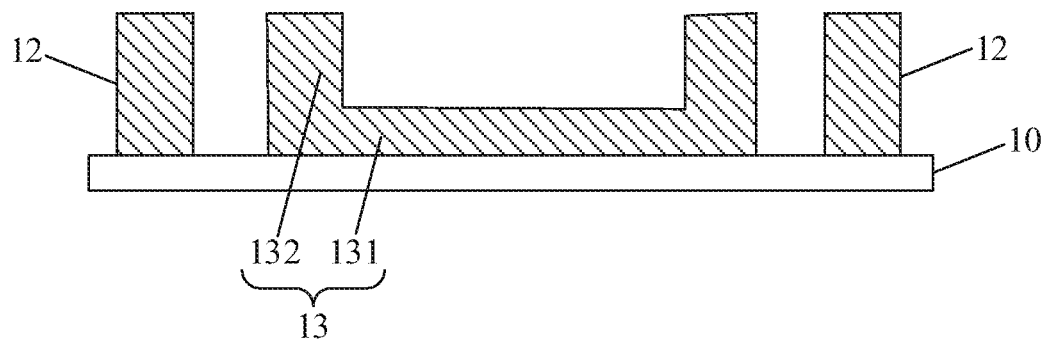
Figure 1C:
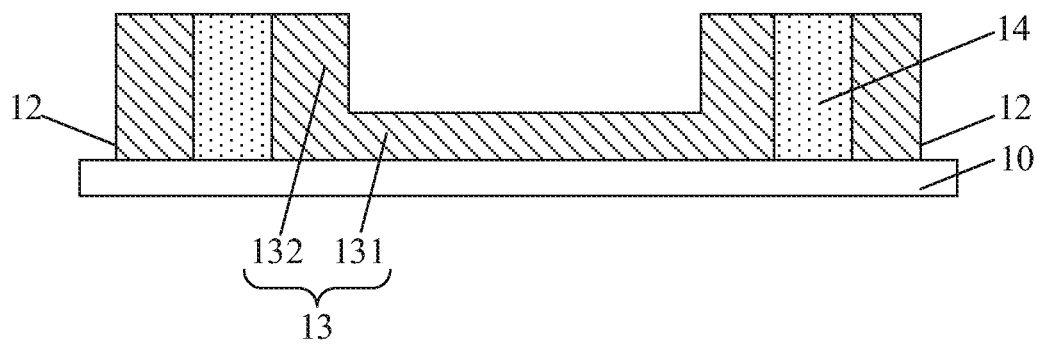
Figure 1D:
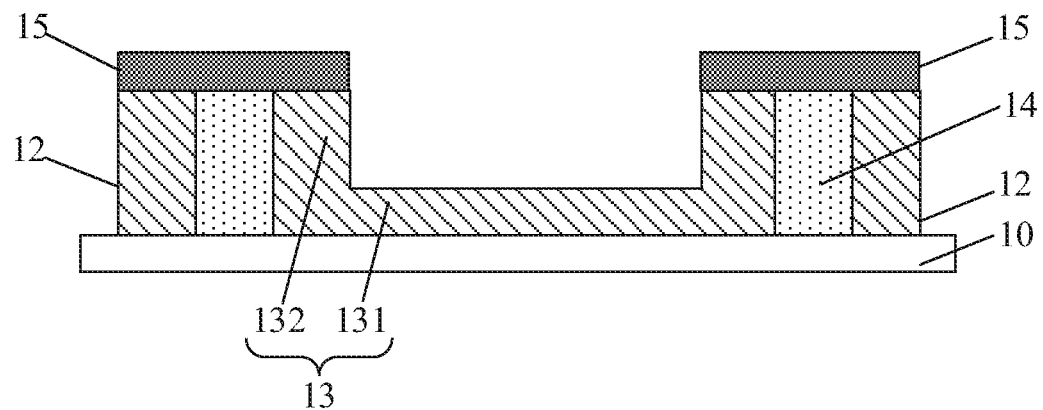
Figure 1E:
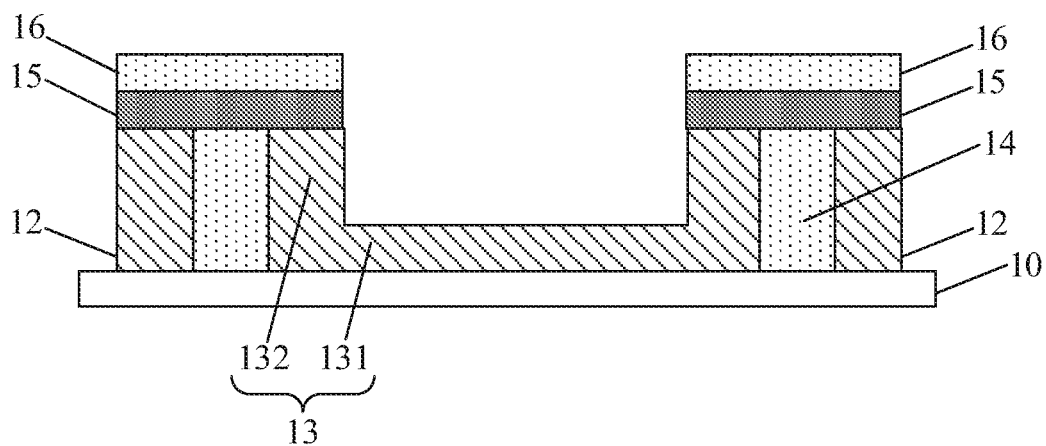
Figure 1F:
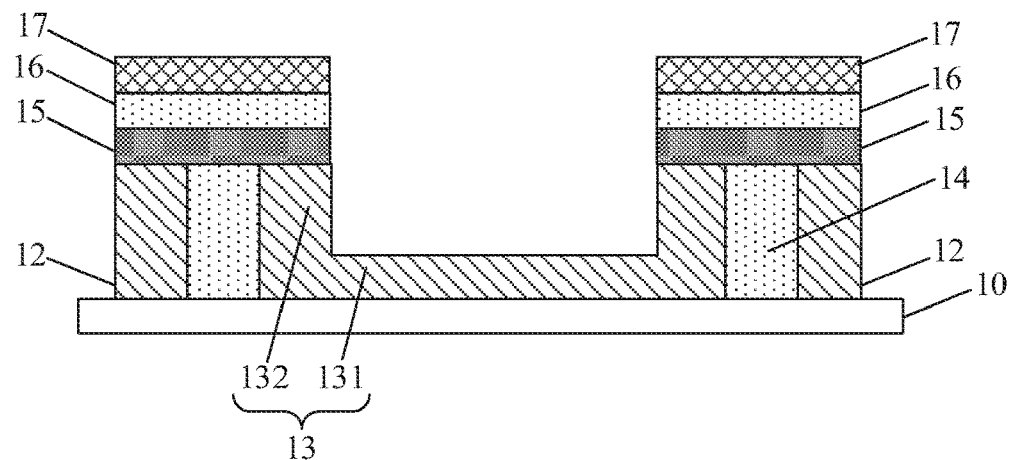
Figure 1G:
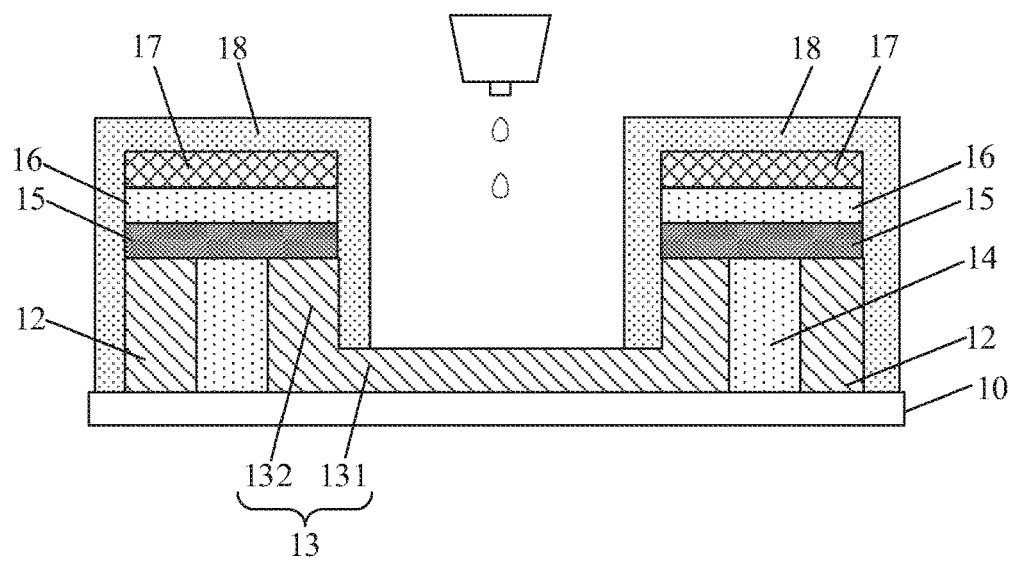

Referring to FIG. 1g, an embodiment of the present disclosure provides a display substrate including a base substrate 10 and a thin film transistor array provided on the base substrate 10. The thin film transistor array includes a plurality of thin film transistors. A first electrode in each thin film transistor includes a first portion 131 and a second portion 132 having a height difference therebetween, and a height of the second portion 132 is greater than a height of the first portion 131 in a direction perpendicular to the base substrate 10.

Specifically, when manufacturing the thin film transistor array on the base substrate 10, a plurality of grooves are defined on a side of the thin film transistor array away from the base substrate 10 by arranging the position, shape and size of the first electrodes 13 of the thin film transistors included in the thin film transistor array. In more detail, a first electrode 13 in each thin film transistor may be arranged to include a first portion 131 and a second portion 132 connected with each other which are arranged such that a height of the second portion 132 is higher than a height of the first portion 131 in a direction perpendicular to the base substrate 10. In this way; the second portion 132 of the first electrode 13 in each thin film transistor can be used as a wall of a groove, and the first portion 131 of the first electrode 13 in each thin film transistor can be used as a bottom of a groove, and thereby a plurality of grooves with accommodating function are defined on the side of the thin film transistor array away from the base substrate 10.

It should be noted that, since the plurality of thin film transistors in the thin film transistor array are distributed in an array, a groove may be defined either by one thin film transistor or by a plurality of adjacent thin film transistors together, by designing a specific structure of the first electrode 13 in the thin film transistor.

In a case that one groove is defined by one thin film transistor, the first portion 131 of the first electrode 13 in this thin film transistor is used as the bottom of the defined groove, and the second portion 132 of the first electrode 13 in this thin film transistor is used as the wall of the defined groove;

in a case that one groove is defined by a plurality of thin film transistors, exemplarily, the first portion 131 of the first electrode 13 in one thin film transistor is used as the bottom of the defined groove, and all the second portions 132 of the first electrodes 13 in the adjacent thin film transistors are used as the wall of the defined groove; alternatively, all the first portions 131 of the first electrodes 13 in the plurality of thin film transistors are used as the bottom of the defined groove, and all the second portions 132 of the first electrodes 13 in the plurality of thin film transistors are used as the wall of the defined groove.

It should be noted that, the groove defined by the thin film transistor array should have a certain depth, which can at least accommodate the light emitting unit, so that when the light emitting units are formed in the grooves, the walls of the grooves are equivalent to the banks of the pixel definition layer in the related art, and the spaces in the grooves are equivalent to the pixel opening regions defined by the pixel definition layer in the related art. When manufacturing the light emitting layers in the light emitting units, ink droplets used to form the light emitting layers in the light emitting units can be dropped into the grooves stably and accurately by inkjet printing technology to form respective light emitting layers.

According to the specific structure of the above display substrate, in the display substrate provided by the embodiment of the present disclosure, the first electrode 13 in each thin film transistor included in the thin film transistor array is provided to include the first portion 131 and the second portion 132 having different heights, so that a plurality of grooves can be defined on the side of the thin film transistor array away from the base substrate 10 by the first portions 131 and the second portions 132 of the first electrodes 13 in the thin film transistors, the walls of the plurality of grooves are equivalent to the banks of the pixel definition layer in the related art, and the spaces in the grooves are equivalent to the pixel opening regions defined by the pixel definition layer in the related art; in this way, when manufacturing the light emitting layers in the light emitting units, the light emitting layers can be formed in the grooves directly by inkjet printing technology, and there is no need to make an additional pixel definition layer to define the pixel regions used for manufacturing the light emitting units. Therefore, the manufacturing of the display substrate provided by the embodiment of the present disclosure avoids the use of coating, exposure, development and curing processes, etc., for manufacturing the pixel definition layer, which simplifies the preparation process of the display substrate; meanwhile, it also avoids the problem of environmental pollution caused by organic materials used for manufacturing the pixel definition layer.

In some embodiments, the display substrate provided in the above embodiment further includes:

an insulation film layer 18 provided on a side of the thin film transistor array away from the base substrate 10, the insulation film layer 18 including a plurality of openings corresponding to the plurality of grooves in one-to-one correspondence, each opening exposing the bottom of a corresponding groove (as shown in the first portion 131 in FIG. 1g);

a plurality of light emitting units provided in the grooves in one-to-one correspondence, each light emitting unit being in contact with the bottom of a corresponding groove, and the thin film transistor corresponding to this groove outputting a driving signal to a corresponding light emitting unit via the bottom to drive the light emitting unit to emit light.

Specifically, the insulation film layer 18 provided on the side of the thin film transistor array away from the base substrate 10 may be of various types, for example, it may be a passivation layer. The size of the opening provided on the insulation film layer 18 can be set according to actual needs. Exemplarily, the opening only exposes the first portion 131 of the first electrode 13 and does not expose other film layers included in the thin film transistor. In more detail, the insulation film layer 18 may be provided to completely cover the inner side wall of the groove, so that the light emitting unit formed in the groove can only contact the first portion 131 of the first electrode 13 which is used as the bottom without contact with other film layers in the thin film transistor, thereby preventing a short circuit between the light emitting unit and other film layers in the thin film transistor, and ensuring a stable working performance of the display substrate.

Figure 6:
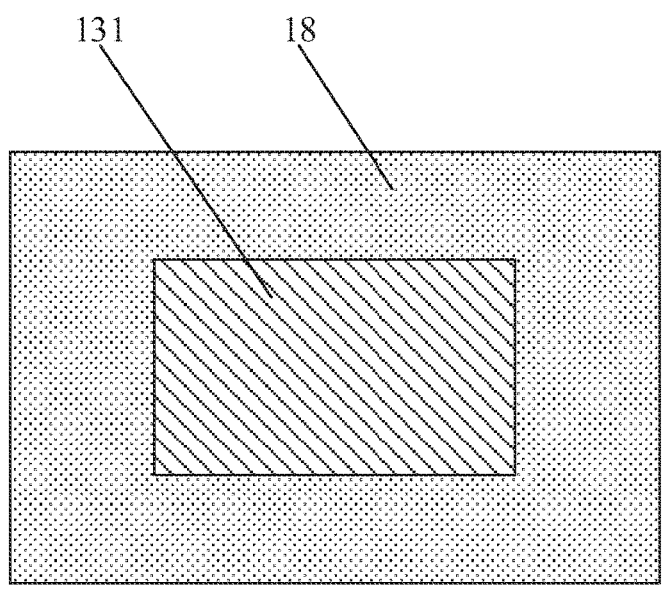
FIG. 6 is a top view of a groove after forming an insulation film layer according to an embodiment of the present disclosure.

In addition, as shown in FIG. 6, an orthographic projection of the insulation film layer 18 on the base substrate 10 can surround an orthographic projection of the first portion 131 of the first electrode 13 on the base substrate.

A thin film transistor generally includes a gate 17, a second electrode 12, a first electrode 13, an active layer 15 and an insulation layer, etc.; and it works as follows: under the control of the gate 17, a driving signal received by the second electrode 12 is output to the light emitting unit via the first electrode 13 to drive the light emitting unit to emit light. In the above embodiment, the insulation film layer 18 is provided on the side of the thin film transistor array away from the base substrate 10, and openings that can expose the bottoms in one-to-one correspondence are formed on the insulation film layer 18, so that the light emitting units formed in the grooves can only be in contact with the bottoms (i.e., the first portions 131 of the first electrodes 13 in the respective thin film transistors). This not only ensures that the thin film transistor can transmit the driving signal to the corresponding light emitting unit through the first portion 131 of the first electrode 13 included therein, but also avoids the short circuit of the light emitting unit and other film layers in the thin film transistor, ensuring a stable working performance of the display substrate.

Further, the light emitting unit provided in the above embodiment may include two opposite electrodes and an light emitting layer provided between the two electrodes; the bottom of the groove is in contact with the light emitting layer in the corresponding light emitting unit, and the bottom of the groove is also used as one of the electrodes of the corresponding light emitting unit.

Specifically, the bottom of the groove corresponding to the light emitting unit can be exposed through the opening on the insulation film layer 18, and the bottom of the groove can be in contact with the corresponding light emitting unit so as to provide a driving signal for the light emitting unit; therefore, the bottom of the groove can be directly used as one of the electrodes of the corresponding light emitting unit, so that the light emitting layer can be directly formed on the bottom of the corresponding groove in manufacturing the light emitting unit, and then the other electrode of the light emitting unit is manufactured on the side of the light emitting layer away from the bottom to complete the manufacture of the light emitting unit, which further simplifies the manufacturing process of the light emitting unit and reduces the manufacturing cost of the display substrate.

There are various manners to define the grooves by the first portions 131 and the second portions 132 of the first electrodes 13 of the thin film transistors, and several specific definition manners are given below.

Figure 3:
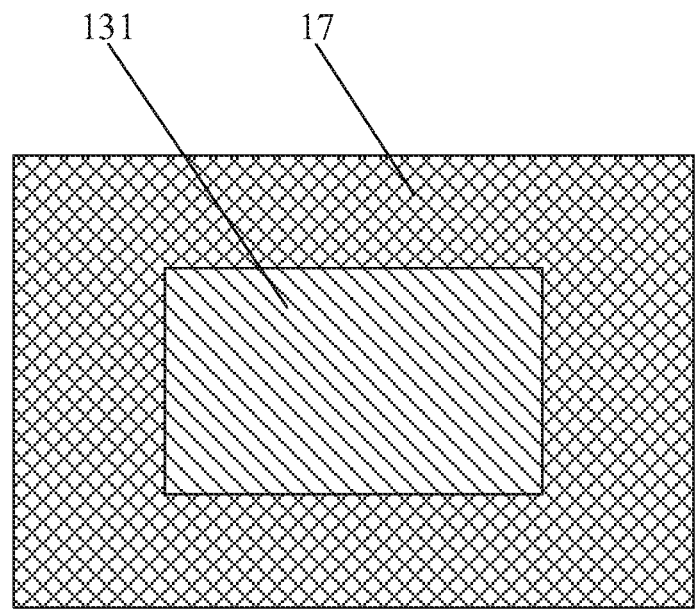
FIG. 3 is a top view of a thin film transistor according to an embodiment of the present disclosure.

First manner: as shown in FIG. 1g and FIG. 3, in a case that a groove corresponds to one thin film transistor (i.e., each groove is defined by the first electrode 13 of a thin film transistor that corresponds to it in one-to-one correspondence), this thin film transistor includes:

a first insulation pattern 14, the second electrode 12 and the first electrode 13 provided on the base substrate 10, where an orthographic projection of the second electrode 12 on the base substrate 10 surrounds an orthographic projection of the first insulation pattern 14 on the base substrate 10, the orthographic projection of the first insulation pattern 14 on the base substrate 10 surrounds an orthographic projection of the first electrode 13 on the base substrate 10, and an orthographic projection of the second portion 132 of the first electrode 13 on the base substrate 10 surrounds an orthographic projection of the first portion 131 of the first electrode 13 on the base substrate 10;

an active layer 15 provided on a side of the second electrode 12 away from the base substrate 10, where the active layer 15 is in contact with the second electrode 12, the first insulation pattern 14 and the second portion 132 of the first electrode 13, respectively, and an orthographic projection of the active layer 15 on the base substrate 10 surrounds the orthographic projection of the first portion 131 of the first electrode 13 on the base substrate 10;

a second insulation pattern 16 provided on a side of the active layer 15 away from the base substrate 10, where an orthographic projection of the second insulation pattern 16 on the base substrate 10 surrounds the orthographic projection of the first portion 131 of the first electrode 13 on the base substrate 10;

a gate 17 provided on a side of the second insulation pattern 16 away from the base substrate 10, where an orthographic projection of the gate 17 on the base substrate 10 is located within the orthographic projection of the second insulation pattern 16 on the base substrate 10, and the orthographic projection of the gate 17 on the base substrate 10 surrounds the orthographic projection of the first portion 131 of the first electrode 13 on the base substrate 10.

Specifically, in the thin film transistor with the above structure, by manufacturing the first electrode 13 including the first portion 131 and the second portion 132 having different heights on the base substrate 10, and making the orthographic projection of the second portion 132 of the first electrode 13 on the base substrate 10 surround the orthographic projection of the first portion 131 of the first electrode 13 on the base substrate 10, the first electrode 13 can be formed as a groove structure; then, by manufacturing sequentially the stacked active layer 15, second insulation pattern 16 and gate 17 on a side of the second electrode 12, the first insulation pattern 14 and the second portion 132 of the first electrode 13 away from the base substrate 10, and forming the active layer 15, the second insulation pattern 16 and the gate 17 such that they all surround the first portion 131 of the first electrode 13, the height of the side wall of the groove formed by the second portion 132 of the first electrode 13 in the direction perpendicular to the base substrate 10 is extended, so that the groove has a deeper depth in the direction perpendicular to the base substrate 10. When the insulation film layer 18 is formed on the thin film transistor of this structure, the insulation film layer 18 can expose the first portion 131 of the first electrode 13 at the bottom, and cover the second portion 132 of the first electrode 13 as well as the active layer 15, the second insulation pattern 16 and the gate 17 located on the extended height of the side wall of the groove simultaneously.

The thin film transistor of the above structure can define a groove enclosed all around, so that when ink droplets used to form the light emitting layer in the light emitting unit are dropped into the groove by inkjet printing technology, the ink droplets can be confined within the groove, and will not flow into other non-pixel regions, thus avoiding cross-coloring caused by the spread of ink droplets in other regions to contaminate adjacent pixels.

Figure 2A:
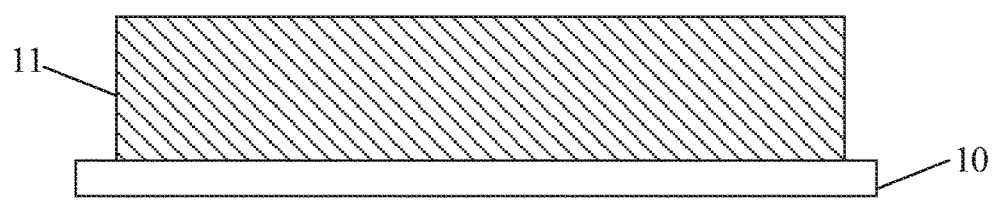
FIG. 2a to FIG. 2g are cross sectional diagrams of grooves in a second mode according to an embodiment of the present disclosure.
Figure 2B:
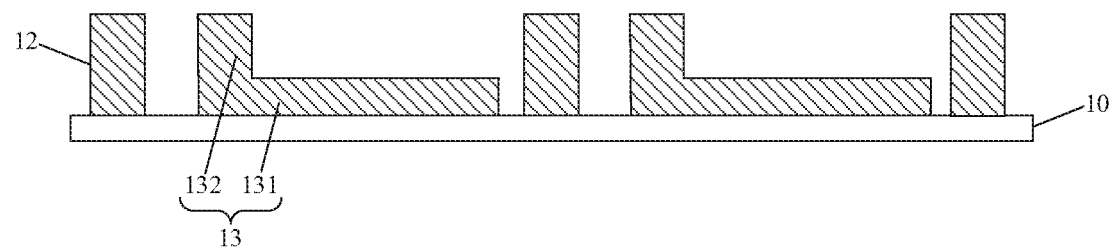
Figure 2C:
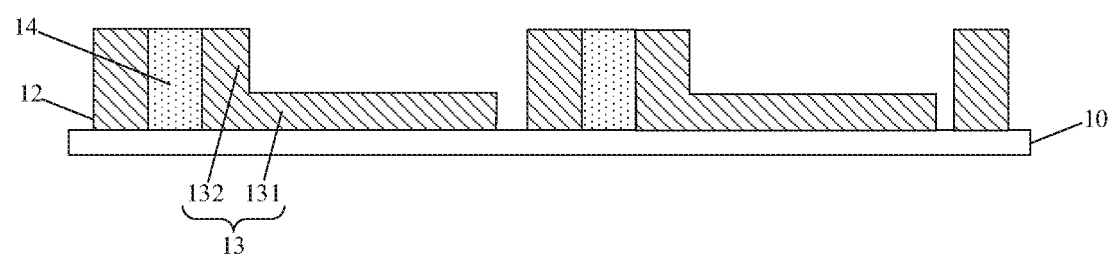
Figure 2D:
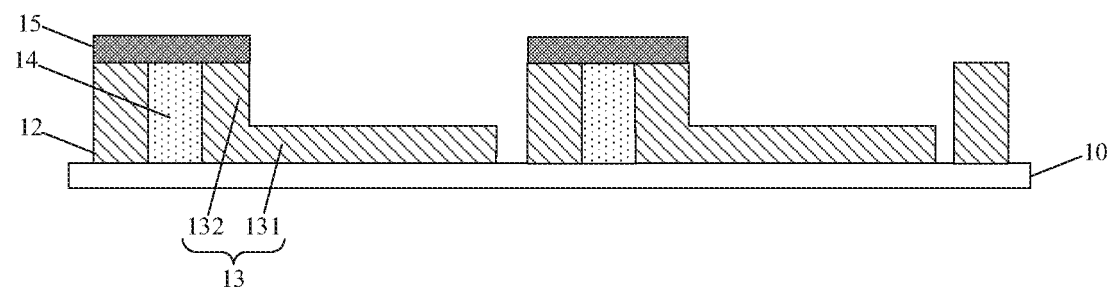
Figure 2E:
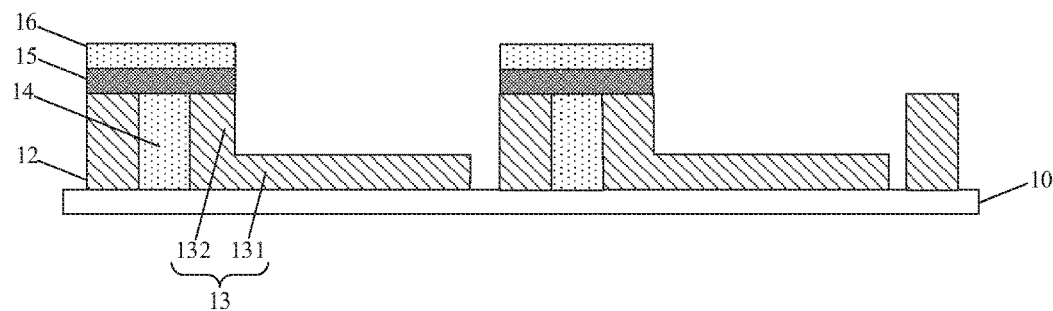
Figure 2F:
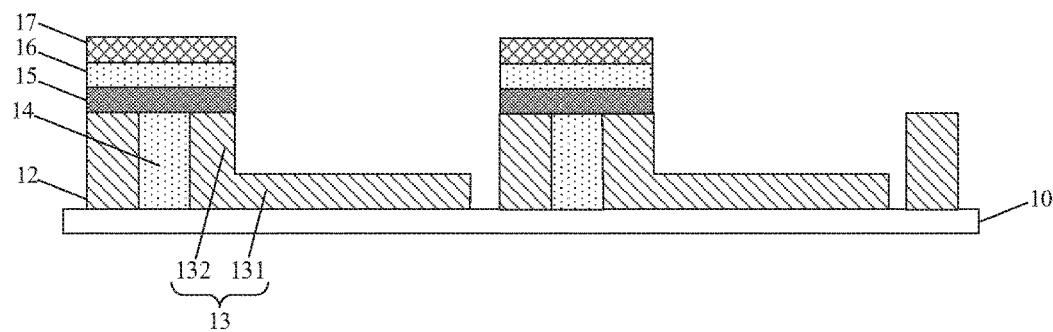
Figure 2G:
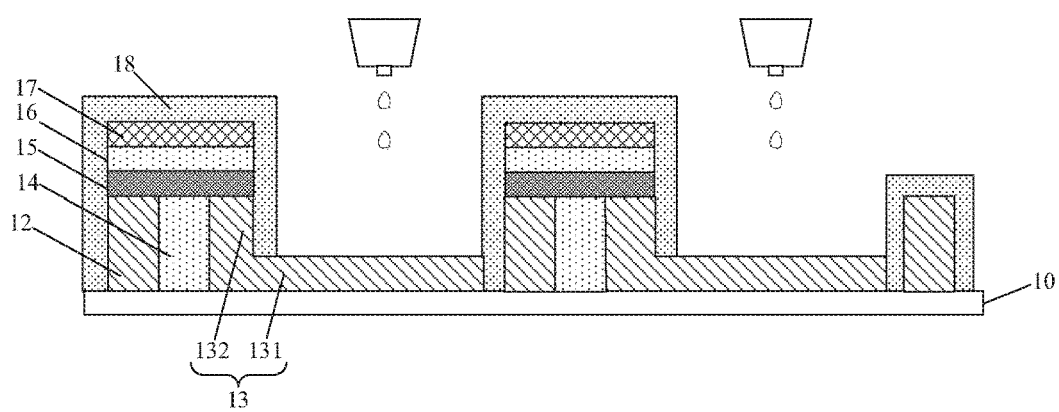
Figure 4:
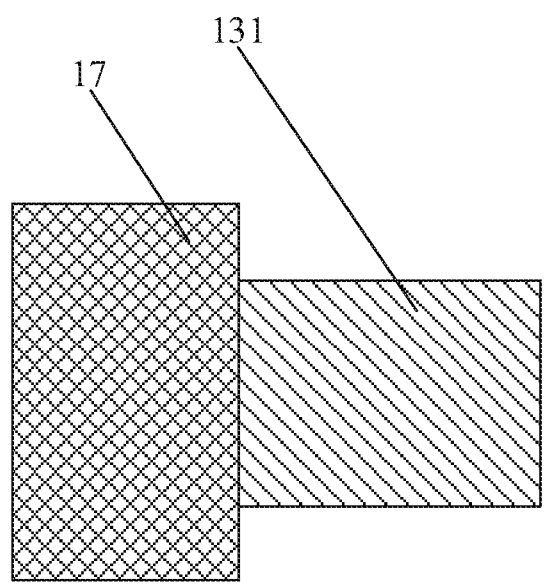
FIG. 4 is a top view of another thin film transistor according to an embodiment of the present disclosure.

Second manner: as shown in FIG. 2g and FIG. 4, in a case that a groove corresponds to two thin film transistors, the second portions 132 of the two thin film transistors are provided on the two opposite side of the groove, respectively. The thin film transistor includes:

a first insulation pattern 14, a second electrode 12 and a first electrode 13 provided on the base substrate, where the first insulation pattern 14 is provided between the second electrode 12 and the first electrode 13;

an active layer 15 provided on a side of the second electrode 12 away from the base substrate 10, where the active layer is in contact with the second electrode 12, the first insulation pattern 14 and the second portion 132 of the first electrode 13, respectively;

a second insulation pattern 16 provided on a side of the active layer 15 away from the base substrate 10;

a gate 17 provided on the side of the second insulation pattern 16 away from the base substrate 10, wherein an orthographic projection of the gate 17 on the base substrate 10 is located within an orthographic projection of the second insulation pattern 16 on the base substrate 10.

Specifically, the above groove corresponds to two thin film transistors, that is, each groove is defined by the first electrodes 13 included in the two thin film transistors together, and the first portion 131 of one of the two thin film transistors is used as the bottom of the groove defined by the thin film transistors.

In the second manner, the second portions 132 of the two thin film transistors corresponding to the groove are provided on two opposite sides of the groove, respectively, and form two opposite walls in the groove, respectively. The first portion 131 of the first electrode 13 in one of the thin film transistors is located between the two walls. The first portion 131 of the first electrode 13 in this thin film transistor is electrically connected to only the second portion 132 of the first electrode 13 in this thin film transistor, and is insulated from the second portion 132 of the first electrode 13 in the other of the two thin film transistors. In addition, the two thin film transistors are two independent thin-film transistors, which control different light emitting units, respectively.

Specifically, in the thin film transistors of the above structure, the second portions 132 of the two thin film transistors corresponding to the groove are provided on two opposite sides of the groove, respectively, and form two opposite walls in the groove, respectively. Then, by manufacturing sequentially the stacked active layer 15, second insulation pattern 16 and gate 17 on a side of the second electrode 12, the first insulation pattern 14 and the second portion 132 of the first electrode 13 corresponding to each thin film transistor away from the base substrate 10, the height of the side wall of the groove formed by the second portion 132 of each first electrode 13 is extended in the direction perpendicular to the base substrate 10, so that the groove has a deeper depth in the direction perpendicular to the base substrate 10. When the insulation film layer 18 is formed on the thin film transistor of this structure, the insulation film layer 18 can expose the first portion 131 of the first electrode 13 at the bottom, and simultaneously cover the second portion 132 of the first electrode 13 as well as the active layer 15, the second insulation pattern 16 and the gate 17 located on the extended height of the side wall of the groove.

The structure of the groove defined by the thin film transistors of the above structure is different from that in the first manner. Such groove that is defined by the two thin film transistors includes only the opposite walls. However, when ink droplets used to form the light emitting layer in the light emitting unit are dropped into the groove by inkjet printing technology, the ink droplets can also be confined within the groove, and will not flow into other regions.

Figure 5:
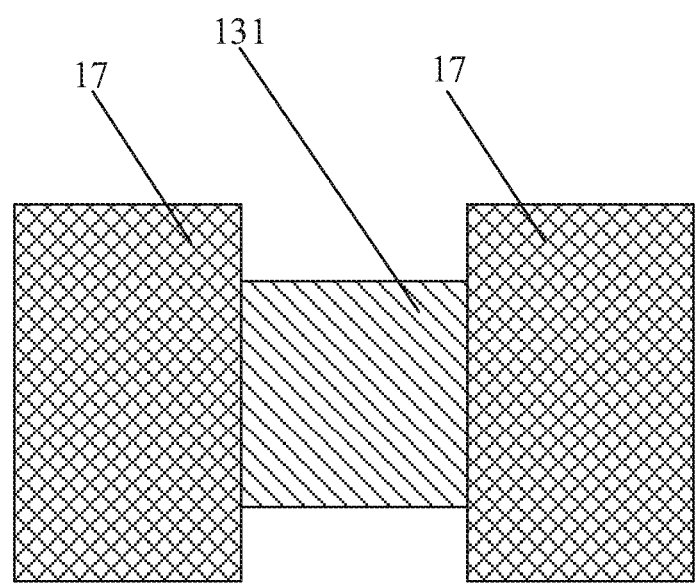
FIG. 5 is a top view of two thin film transistors corresponding to one groove according to an embodiment of the present disclosure.

Third manner: as shown in FIG. 1g and FIG. 5, in a case that a groove corresponds to two thin film transistors, the second portions 132 of the two thin film transistors are provided on the two opposite sides of the groove, respectively, and each thin film transistor includes:

a first insulation pattern 14, a second electrode 12 and a first electrode 13 provided on the base substrate 10, where the first insulation pattern 14 is provided between the second electrode 12 and the first electrode 13;

an active layer 15 provided on a side of the second electrode 12 away from the base substrate 10, where the active layer 15 is in contact with the second electrode 12, the first insulation pattern 14 and the second portion 132 of the first electrode 13, respectively;

a second insulation pattern 16 provided on a side of the active layer 15 away from the base substrate 10;

a gate 17 provided on a side of the second insulation pattern 16 away from the base substrate 10, where an orthographic projection of the gate 17 on the base substrate 10 is located within an orthographic projection of the second insulation pattern 16 on the base substrate 10;

the gates 17 of the two thin film transistors are connected with each other, the second electrodes 12 of the two thin film transistors are connected with each other, and the first electrodes 13 of the two thin film transistors are connected with each other.

Optionally, the above groove corresponds to two thin film transistors, the groove is defined by the first electrodes 13 included in the two thin film transistors together, and both the first portions 131 of the first electrodes 13 in the two thin film transistors are used as the bottom of the groove defined by the two thin film transistors.

In the third manner, the second portions 132 of the two thin film transistors corresponding to the groove are provided on two opposite sides of the groove, respectively, and form two opposite walls in the groove, respectively. Both the first portions 131 of the first electrodes 13 in the two thin film transistors are located between the two walls, and the gates 17 of the two thin film transistors are connected with each other, the second electrodes 12 of the two thin film transistors are connected with each other, and the first electrodes 13 of the two thin film transistors are connected with each other (a same first electrode 13 may also be shared), and the two thin film transistors are used to drive a same light emitting unit.

Specifically, in the thin fila transistors of the above structure, the second portions 132 of the two thin film transistors corresponding to the groove are provided on two opposite sides of the groove, respectively, and form two opposite walls in the groove, respectively. Then, by manufacturing sequentially the stacked active layer 15, second insulation pattern 16 and gate 17 on the side of the second electrode 12, the first insulation pattern 14 and the second portion 132 of the first electrode 13 corresponding to each thin film transistor away from the base substrate 10, the height of the side wall of the groove formed by the second portion 132 of each first electrode 13 is extended in the direction perpendicular to the base substrate 10, so that the groove has a deeper depth in the direction perpendicular to the base substrate 10. When the insulation film layer 18 is formed on the thin film transistor of this structure, the insulation film layer 18 can expose the first portion 131 of the first electrode 13 at the bottom, and cover the second portion 132 of the first electrode 13 as well as the active layer 15, the second insulation pattern 16 and the gate 17 located on the extended height of the side wall of the groove simultaneously.

The groove defined by the thin film transistors of the above structure includes only the opposite walls. However, when ink droplets used to form the light emitting layer in the light emitting unit are dropped into the pixel region by inkjet printing technology, the ink droplets can also be confined within the groove, and will not flow into other regions.

It should be noted that in the above three manners, the second electrode 12 in each thin film transistor may include a drain and the first electrode 13 may include a source; alternatively, the second electrode 12 may include a source, and the first electrode 13 may include a drain.

In addition, in practical applications, the above three manners may be selected according to actual needs. More specifically, among the above three manners, the first and the second manners each are to drive a corresponding light emitting unit through one thin film transistor, while the third method is to drive a corresponding light emitting unit through two thin film transistors. When a light emitting unit with a small brightness is required, the first manner or the second manner may be selected. When a strong driving capability is required to obtain a greater brightness of the light emitting unit, the third manner may be selected.

In some embodiments, an arrangement may be employed in which the height of the second electrode 12 is equal to the height of the second portion 132 of the first electrode 13 in the direction perpendicular to the base substrate 10; and/or, the height of the first insulation pattern 14 is equal to the height of the second portion 132 of the first electrode 13 in the direction perpendicular to the base substrate 10. In other words, according to some embodiments of the present disclosure, the surfaces of the second electrode 12, the second portion 132 of the first electrode 13 and/or the first insulation pattern 14 away from the base substrate 10 may have the same height, that is, at least the surfaces of the two away from the base substrate 10 may be formed as a flat surface.

Specifically, in the direction perpendicular to the base substrate 10, the height of the second electrode 12 is set to be equal to the height of the second portion 132 of the first electrode 13; and/or, the height of the first insulation pattern 14 is set to be equal to the height of the second portion 132 of the first electrode 13, which enables the active layer 15 formed above the three to have no step difference, that is, the surface of the active layer 15 used to form the second insulation pattern 16 is flatter, thereby making the second insulation 16 and the gate 17 formed above the active layer 15 have no step difference therebetween, which is more beneficial to the stability of the display substrate.

In addition, the second electrode 12 and the second portion 132 of the first electrode 13 are provided with a thicker thickness in the direction perpendicular to the base substrate 10, so that the resistances of the second electrode 12 and the first electrode 13 are smaller, and more suitable for large-size display substrates.

In some embodiments, a portion of the insulation film layer 18 outside the groove may be arranged such that a surface thereof away from the base substrate 10 is hydrophobic.

Specifically, after the insulation film layer 18 is manufactured, the portion of the insulation film layer 18 outside the groove may be exposed to ultraviolet light so that the surface away from the base substrate 10 of the portion of the insulation film layer 18 outside the groove is hydrophobic.

Since the light emitting layer in the light emitting unit is typically manufactured by inkjet printing technology, the fact that the surface away from the base substrate 10 of the portion of the insulation film layer 18 outside the groove is hydrophobic can cause the droplets used to form the light emitting layer to be printed into the groove more stably and accurately when forming the light emitting layer by inkjet printing technology.

An embodiment of the present disclosure also provides a display device including the display substrate provided by the above embodiment.

The display substrate provided in the above embodiments not only avoids the use of coating, exposure, development and curing processes, etc., to manufacture the pixel definition layer, which simplifies the manufacturing process of the display substrate, but also avoids the problem of environmental pollution caused by organic materials used for manufacturing the pixel definition layer; therefore, when the display device provided by the embodiment of the present disclosure includes the display substrate provided by the above embodiment, it also has the advantages of simple manufacturing process, saving manufacturing cost, and no environmental pollution.

It should be noted that the display device may be any product or component with a display function, such as a television, a display, a mobile phone, a tablet computer, and the like.

An embodiment of the present disclosure further provides a manufacturing method of a display substrate, which is used to manufacture the display substrate provided by the above embodiment. The manufacturing method includes:

providing a base substrate 10;

manufacturing a thin film transistor array on the base substrate 10, the thin film transistor array including a plurality of thin film transistors, a first electrode 13 in each thin film transistor including a first portion 131 and a second portion 132 having a height difference therebetween, and a height of the second portion 132 being greater than a height of the first portion 131 in a direction perpendicular to the base substrate 10.

Specifically, a base substrate 10 is provided first, the base substrate 10 may be a glass base substrate. And then, a thin film transistor array may be made on the base substrate 10 by using the manufacturing process for making the thin film transistor in the related art. By arranging the position, shape and size of the first electrodes 13 of the thin film transistors included in the thin film transistor array, a plurality of grooves are defined on a side of the thin film transistor array away from the base substrate 10. In more detail, a first electrode 13 in each thin film transistor may be arranged to include the first portion 131 and the second portion 132 connected with each other which are arranged such that a height of the second portion 132 is higher than a height of the first portion 131 in a direction perpendicular to the base substrate 10, In this way, the second portion 132 of the first electrode 13 in each thin film transistor can be used as a wall of a groove, and the first portion 131 of the first electrode 13 in each thin film transistor can be used as a bottom of a groove, and thereby a plurality of grooves with accommodating function are defined on the side of the thin film transistor array away from the base substrate 10.

In the manufacturing method of a display substrate provided by the embodiment of the present disclosure, the first electrode 13 in each thin film transistor included in the thin film transistor array is formed to include the first portion 131 and the second portion 132 having different heights, so that a plurality of grooves can be defined on the side of the thin film transistor array away from the base substrate 10 by the first portions 131 and the second portions 132 of the first electrodes 13 in the thin film transistors, the walls of the plurality of grooves are equivalent to the banks of the pixel definition layer in the related art, and the spaces in the grooves are equivalent to the pixel opening regions defined by the pixel definition layer in the related art; in this way, when manufacturing the light emitting layers in the light emitting units, the light emitting layers can be formed in the grooves directly by inkjet printing technology, and there is no need to make an additional pixel definition layer to define the pixel regions used for manufacturing the light emitting units. Therefore, when manufacturing a display substrate by the manufacturing method provided by the embodiment of the present disclosure, it is avoided to use coating, exposure, development and curing processes, etc., for manufacturing the pixel definition layer, which simplifies the preparation process of the display substrate; meanwhile, the problem of environmental pollution caused by organic materials used for manufacturing the pixel definition layer is also avoided.

In some embodiments, the above manufacturing method further includes:

manufacturing an insulation film layer 18 on a side of the thin film transistor array away from the base substrate 10, the insulation film layer 18 including a plurality of openings corresponding to the plurality of grooves in one-to-one correspondence, each opening exposing the bottom of a corresponding groove;

manufacturing a plurality of light emitting units in the grooves, the light emitting units corresponding to the grooves in one-to-one correspondence, each light emitting unit being in contact with the bottom of a corresponding groove, and a thin film transistor corresponding to this groove being used to output a driving signal to the corresponding light emitting unit via the bottom, so as to drive the light emitting unit to emit light.

Specifically, after manufacturing the thin film transistor array, the insulation film layer 18 may be deposited on the side of the thin film transistor array away from the base substrate 10, and the plurality of openings corresponding to the grooves in one-to-one correspondence are formed on the insulation film layer 18 by patterning process, where each opening exposes the bottom of a corresponding groove. Then, a corresponding light emitting unit is formed in each groove such that it is in contact with the bottom of the corresponding groove.

It should be noted that the material of the insulation film layer 18 may be silicon oxide, silicon nitride, or aluminum oxide, or the like. The insulation film layer 18 may be used as a passivation layer.

In addition, the size of the opening formed in the insulation film layer 18 may be set according to actual needs. Exemplarily, the opening exposes only the first portion 131 of the first electrode 13 and does not expose other film layers included in the thin film transistor. In more detail, the insulation film layer 18 may completely cover the inner side wall of the groove, so that the light emitting unit formed in the groove can be in contact with only the first portion 131 of the first electrode 13 which is used as the bottom and will be not in contact with other film layers in the thin film transistor, which not only ensures that the thin film transistor can transmit a driving signal to the corresponding light emitting unit through the first part 131 of the first electrode 13 included in it, but also avoids short circuit occurring between the light emitting unit and the other film layers in the thin film transistor, thus ensuring the stable working performance of the display substrate.

In some embodiments, the light emitting unit may include two opposite electrodes and a light emitting layer provided between the two electrodes; the step of manufacturing the light emitting unit in the groove includes:

manufacturing the light emitting layer in a groove, the light emitting layer being in contact with the bottom of the corresponding groove, the bottom of the groove being also used as one of the electrodes in the corresponding light emitting unit; and manufacturing the other electrode in the light emitting unit on a side of the light emitting layer away from the base substrate 10.

Specifically, since the bottom of the groove corresponding to the light emitting unit can be exposed through the opening on the insulation film layer 18, and the bottom of the groove can be in contact with the corresponding light emitting unit to provide a driving signal for the light emitting unit, the bottom of the groove can be directly used as one of the electrodes in the corresponding light emitting unit. In this way, when manufacturing the light emitting unit, the ink droplets used to form the light emitting layer in the light emitting unit may be dropped to the bottom exposed in the groove by inkjet printing technology, so as to form the light emitting layer; and then, the other electrode of the light emitting unit is manufactured on the side of the light emitting layer away from the bottom to complete the manufacture of the light emitting unit.

By using the bottom as one of the electrodes in the corresponding light emitting unit as mentioned above, the manufacturing process flow of the light emitting unit is further simplified, and the manufacturing cost of the display substrate is reduced.

There are various manners to define the grooves by the first portions 131 and the second portions 132 of the first electrodes 13 of the thin film transistors, and the manufacturing procedure of the thin film transistor in several specific definition manners is given below.

First manner: in a case that a groove corresponds to one thin film transistor, as shown in FIG. 1a to FIG. 1g, specific steps for manufacturing the thin film transistor are as follows:

manufacturing a first insulation pattern 14, a second electrode 12, and a first electrode 13 on the base substrate 10, an orthographic projection of the second electrode 12 on the base substrate 10 surrounding an orthographic projection of the first insulation pattern 14 on the base substrate 10, the orthographic projection of the first insulation pattern 14 on the base substrate 10 surrounding an orthographic projection of the first electrode 13 on the base substrate 10, and an orthographic projection of the second portion 132 in the first electrode 13 on the base substrate 10 surrounding an orthographic projection of the first portion 131 in the first electrode 13 on the base substrate 10;

manufacturing an active layer 15 on a side of the second electrode 12 away from the base substrate 10, the active layer 15 being in contact with the second electrode 12, the first insulation pattern 14 and the second portion 132 of the first electrode 13, respectively, an orthographic projection of the active layer 15 on the base substrate 10 surrounding the orthographic projection of the first portion 131 in the first electrode 13 on the base substrate 10;

manufacturing a second insulation pattern 16 on a side of the active layer 15 away from the base substrate 10, an orthographic projection of the second insulation pattern 16 on the base substrate 10 surrounding the orthographic projection of the first portion 131 in the first electrode 13 on the base substrate on 10;

manufacturing a gate 17 on a side of the second insulation pattern 16 away from the base substrate 10, an orthographic projection of the gate 17 on the base substrate 10 being located within the orthographic projection of the second insulation pattern 16 on the base substrate 10, the orthographic projection of the grid 17 on the base substrate 10 surrounding the orthographic projection of the first portion 131 in the first electrode 13 on the base substrate 10.

Specifically, as shown in FIG. 1a, a layer of conductive film 11 is deposited on the base substrate 10 using a magnetron sputtering device, and the conductive film 11 is patterned, as shown in FIG. 1b, to form a second electrode 12 and the first electrode 13. The material of the conductive film 11 may be Cu, Al or indium tin oxide (ITO), etc.; then a first insulation film is formed by using plasma enhanced chemical vapor deposition method, and the first insulation film is patterned, as shown in FIG. 1c, to form a first insulation pattern 14. The material of the first insulation film may be silicon oxide, silicon nitride, or the like, or the first insulation pattern 14 may be made of organic materials.

In more detail, in a case that the manufactured first electrode 13 includes the first portion 131 and the second portion 132, and in a direction perpendicular to the base substrate 10, the height of the second portion 132 is greater than the height of the first portion 131, and the height of the second portion 132 is equal to the height of the second electrode 12, the second electrode 12, the first portion 131 and the second portion 132 of the first electrode 13 may be formed simultaneously by a single patterning process using a half-tone mask.

As shown in FIG. 1d, the magnetron sputtering device or the solution method is further used and is combined with the patterning process, the active layer 15 being in contact with the second electrode 12, the first insulation pattern 14, and the second portion 132 of the first electrode 13 is manufactured on the side of the second electrode 12 away from the base substrate 10, and the orthographic projection of the active layer 15 on the base substrate 10 surrounds the orthographic projection of the first portion 131 of the first electrode 13 on the base substrate 10.

As shown in FIG. 1e, the plasma enhanced chemical vapor deposition method is further used to form a second insulation film on the side of the active layer 15 away from the base substrate 10, and the second insulation film is patterned to form a second insulation pattern 16. The material of the second insulation film may be silicon oxide, silicon nitride, etc., and the second insulation pattern 16 is used as the gate insulation layer in the thin film transistor. The orthographic projection of the second insulation pattern 16 on the base substrate 10 surrounds the orthographic projection of the first portion 131 of the first electrode 13 on the base substrate 10.

As shown in FIG. 1f, finally, a layer of conductive film is deposited on the side of the second insulation pattern 16 away from the base substrate 10 by the magnetron sputtering device, and the conductive film is patterned to form a gate 17, The orthographic projection of the gate 17 on the base substrate 10 is located within the orthographic projection of the second insulation pattern 16 on the base substrate 10, and the orthographic projection of the gate 17 on the base substrate 10 surrounds the orthographic projection of the first portion 131 of the first electrode 13 on the base substrate 10; the material of the conductive film may be Cu, Al, indium tin oxide (ITO), or the like.

In the thin film transistor manufactured by the above manufacturing method, the first electrode 13 having the first portion 131 and the second portion 132 with different heights is formed on the base substrate 10, and the orthographic projection of the second portion 132 of the first electrode 13 on the substrate is arranged to surround the orthographic projection of the first portion 131 of the first electrode 13 on the base substrate 10, so that the first electrode 13 can be formed into a groove structure; and then, by manufacturing sequentially the stacked active layer 15, second insulation pattern 16 and gate 17 on the side of the second electrode 12, the first insulation pattern 14 and the second portion 132 of the first electrode 13 away from the base substrate 10, and forming the active layer 15, the second insulation pattern 16 and the gate 17 such that they all surround the first portion 131 of the first electrode 13, the height of the side wall of the groove formed by the second portion 132 of the first electrode 13 in the direction perpendicular to the base substrate 10 is extended, so that the groove has a deeper depth in the direction perpendicular to the base substrate 10. When the insulation film layer 18 is formed on the thin film transistor of this structure, the insulation film layer 18 can expose the first portion 131 of the first electrode 13 at the bottom, and cover the second portion 132 of the first electrode 13 as well as the active layer 15, the second insulation pattern 16 and the gate 17 located on the extended height of the side wall of the groove simultaneously.

The thin film transistor manufactured by the above manufacturing method can define an enclosed groove, so that when ink droplets used to form the light emitting layer in the light emitting unit are dropped into the groove by inkjet printing technology, the ink droplets can be confined within the groove, and will not flow into other regions, thus avoiding cross-coloring caused by the spread of ink droplets in other regions to contaminate adjacent pixels.

Second manner: in a case that a groove corresponds to two thin film transistors, the second portions 132 of the two thin film transistors are provided on the two opposite side of the groove, respectively. As shown in FIG. 2a to FIG. 2g, specific steps tor manufacturing the thin film transistor are as follows:

manufacturing a first insulation pattern 14, a second electrode 12, and a first electrode 13 on the base substrate 10, the first insulation pattern 14 being provided between the second electrode 12 and the first electrode 13;

manufacturing an active layer 15 on a side of the second electrode 12 away from the base substrate 10, the active layer 15 being in contact with the second electrode 12, the first insulation pattern 14 and the second portion 132 of the first electrode 13, respectively;

manufacturing a second insulation pattern 16 on a side of the active layer 15 away from the base substrate 10;

manufacturing a gate 17 on a side of the second insulation pattern 16 away from the base substrate 10, an orthographic projection of the gate 17 on the base substrate 10 being located within the orthographic projection of the second insulation pattern 16 on the base substrate 10.

Specifically, as shown in FIG. 2a, first, a layer of conductive film 11 is deposited on the base substrate 10 using a magnetron sputtering device, and the conductive film 11 is patterned, as shown in FIG. 2b, to form a second electrode 12 and the first electrode 13. The material of the conductive film 11 may be Cu, Al or indium tin oxide (ITO), etc.; then a first insulation film is formed by using plasma enhanced chemical vapor deposition method, and the first insulation film is patterned, as shown in FIG. 1c, to form a first insulation pattern 14. The material of the first insulation film may be silicon oxide, silicon nitride, or the like, or the first insulation pattern 14 may be made of organic materials.

In more detail, in a case that the manufactured first electrode 13 includes the first portion 131 and the second portion 132, and in a direction perpendicular to the base substrate 10, the height of the second portion 132 is greater than the height of the first portion 131, and the height of the second portion 132 is equal to the height of the second electrode 12, the second electrode 12, the first portion 131 and the second portion 132 of the first electrode 13 may be formed simultaneously by a single patterning process using a half-tone mask.

As shown in FIG. 2d, the magnetron sputtering device or the solution method is further used and is combined with the patterning process, the active layer 15 being in contact with the second electrode 12, the first insulation pattern 14, and the second portion 132 of the first electrode 13 is manufactured on the side of the second electrode 12 away from the base substrate 10.

As shown in FIG. 2e, the plasma enhanced chemical vapor deposition method is further used to form a second insulation film on the side of the active layer 15 away from the base substrate 10, and the second insulation film is patterned to form a second insulation pattern 16. The material of the second insulation film may be silicon oxide, silicon nitride, etc., and the second insulation pattern 16 is used as the gate insulation layer in the thin film transistor.

As shown in FIG. 2f, finally, a layer of conductive film is deposited on the side of the second insulation pattern 16 away from the base substrate 10 by the magnetron sputtering device, and the conductive film is patterned to form a gate 17. The orthographic projection of the gate 17 on the base substrate 10 is located within the orthographic projection of the second insulation pattern 16 on the base substrate 10, and the material of the conductive film may be Cu, Al, indium tin oxide (ITO), or the like.

The above groove corresponds to two thin film transistors, and is defined by the first electrodes 13 included in the two thin film transistors together, where the first portion 131 of the first electrode 13 in one of the thin film transistors is used as the bottom of the groove.

In the second manner, the second portions 132 of the two thin film transistors corresponding to the groove are provided on two opposite sides of the groove, respectively, and form two opposite walls in the groove, respectively. The first portion 131 of the first electrode 13 in one of the thin film transistors is located between the two walls. The first portion 131 of the first electrode 13 in this thin film transistor is electrically connected to only the second portion 132 of the first electrode 13 in this thin film transistor, and is insulated from the second portion 132 of the first electrode 13 in the other of the two thin film transistors. In addition, the two thin film transistors are two independent thin-film transistors, which control different light emitting units, respectively.

In the thin film transistors manufactured by the above manufacturing method, the second portions 132 of the two thin film transistors corresponding to the groove are provided on two opposite sides of the groove, respectively, and form two opposite walls in the groove, respectively. Then, by manufacturing sequentially the stacked active layer 15, second insulation pattern 16 and gate 17 on the side of the second electrode 12, the first insulation pattern 14 and the second portion 132 of the first electrode 13 corresponding to each thin film transistor away from the base substrate 10, the height of the side wall of the groove formed by the second portion 132 of each first electrode 13 is extended in the direction perpendicular to the base substrate 10, so that the groove has a deeper depth in the direction perpendicular to the base substrate 10. When the insulation film layer 18 is formed on the thin film transistor of this structure, the insulation film layer 18 can expose the first portion 131 of the first electrode 13 at the bottom, and cover the second portion 132 of the first electrode 13 as well as the active layer 15, the second insulation pattern 16 and the gate 17 located on the extended height of the side wall of the groove simultaneously.

The structure of the groove defined by the thin film transistors manufactured by the above manufacturing method is different from that in the first manner. Such groove that is defined by the two thin film transistors includes only the opposite walls. However, when ink droplets used to form the light emitting layer in the light emitting unit are dropped into the groove by inkjet printing technology, the ink droplets can also be confined within the groove, and will not flow into other regions.

Third manner: in a case that a groove corresponds to two thin film transistors, the second portions 132 of the two thin film transistors are provided on the two opposite sides of the groove, respectively. Specific steps for manufacturing the thin film transistor are as follows:

manufacturing a first insulation pattern 14, a second electrode 12 and a first electrode 13 on the base substrate 10, the first insulation pattern 14 being provided between the second electrode 12 and the first electrode 13;

manufacturing an active layer 15 on a side of the second electrode 12 away from the base substrate 10, the active layer 15 being in contact with the second electrode 12, the first insulation pattern 14 and the second portion 132 of the first electrode 13, respectively;

manufacturing a second insulation pattern 16 on a side of the active layer 15 away from the base substrate 10;

manufacturing a gate 17 on a side of the second insulation pattern 16 away from the base substrate 10, an orthographic projection of the gate 17 on the base substrate 10 being located within an orthographic projection of the second insulation pattern 16 on the base substrate 10;

the gates 17 of the two thin film transistors being connected with each other, the second electrodes 12 of the two thin film transistors being connected with each other, and the first electrodes 13 of the two thin film transistors being connected with each other.

Specifically, first, a layer of conductive film 11 is deposited on the base substrate 10 using a magnetron sputtering device, and the conductive film 11 is patterned to form a second electrode 12 and the first electrode 13. The material of the conductive film 11 may be Cu, Al or indium tin oxide (ITO), etc.; then a first insulation film is formed by using plasma enhanced chemical vapor deposition method, and the first insulation film is patterned to form a first insulation pattern 14. The material of the first insulation film may be silicon oxide, silicon nitride, or the like, or the first insulation pattern 14 may be made of organic materials.

In more detail, in a case that the manufactured first electrode 13 includes the first portion 131 and the second portion 132, and in a direction perpendicular to the base substrate 10, the height of the second portion 132 is greater than the height of the first portion 131, and the height of the second portion 132 is equal to the height of the second electrode 12, the second electrode 12, the first portion 131 and the second portion 132 of the first electrode 13 may be formed simultaneously by a single patterning process using a half-tone mask.

Then, the magnetron sputtering device or the solution method is further used and is combined with the patterning process, the active layer 15 being in contact with the second electrode 12, the first insulation pattern 14, and the second portion 132 of the first electrode 13 is manufactured on the side of the second electrode 12 away from the base substrate 10.

Then, the plasma enhanced chemical vapor deposition method is further used to form a second insulation film on the side of the active layer 15 away from the base substrate 10, and the second insulation film is patterned to form a second insulation pattern 16, The material of the second insulation film may be silicon oxide, silicon nitride, etc., and the second insulation pattern 16 is used as the gate insulation layer in the thin film transistor.

Finally, a layer of conductive film is deposited on the side of the second insulation pattern 16 away from the base substrate 10 by the magnetron sputtering device, and the conductive film is patterned to form a gate 17. The orthographic projection of the gate 17 on the base substrate 10 is located within the orthographic projection of the second insulation pattern 16 on the base substrate 10, and the material of the conductive film may be Cu, Al, indium tin oxide (ITO), or the like.

The above groove corresponds to two thin film transistors, and is defined by the first electrodes 13 included in the two thin film transistors together, and both the first portions 131 of the first electrodes 13 in the two thin film transistors are used as the bottom of the groove.

In the third manner, the second portions 132 of the two thin film transistors corresponding to the groove are provided on two opposite sides of the groove, respectively, and form two opposite walls in the groove, respectively. Both the first portions 131 of the first electrodes 13 in the two thin film transistors are located between the two walls. The gates 17 in the two thin film transistors are connected with each other, the second electrodes 12 in the two thin film transistors are connected with each other, and the first electrodes 13 in the two thin film transistors are connected with each other. The two thin film transistors are used to drive a same light emitting unit.

In the thin film transistors manufactured by the above manufacturing method, the second portions 132 of the two thin film transistors corresponding to the groove are provided on two opposite sides of the groove, respectively, and form two opposite walls in the groove, respectively. Then, by manufacturing sequentially the stacked active layer 15, second insulation pattern 16 and gate 17 on the side of the second electrode 12, the first insulation pattern 14 and the second portion 132 of the first electrode 13 corresponding to each thin film transistor away from the base substrate 10, the height of the side wall of the groove formed by the second portion 132 of each first electrode 13 is extended in the direction perpendicular to the base substrate 10, so that the groove has a deeper depth in the direction perpendicular to the base substrate 10. When the insulation film layer 18 is formed on the thin film transistor of this structure, the insulation film layer 18 can expose the first portion 131 of the first electrode 13 at the bottom, and cover the second portion 132 of the first electrode 13 as well as the active layer 15, the second insulation pattern 16 and the gate 17 located on the extended height of the side wall of the groove simultaneously.

The structure of the groove defined by the thin film transistors manufactured by the above manufacturing method includes only the opposite walls. However, when ink droplets used to form the light emitting layer in the light emitting unit are dropped into the pixel region by inkjet printing technology, the ink droplets can also be confined within the groove, and will not flow into other regions.

In some embodiments, the insulation film layer 18 provided by the above embodiment includes an inorganic layer, the light emitting unit includes a first pixel electrode and a second pixel electrode opposite to each other, and an organic light emitting functional layer provided between the first pixel electrode and the second pixel electrode, and the bottom of the groove is also used as the first pixel electrode of the corresponding light emitting unit; the step of manufacturing the light emitting unit includes:

printing organic solution in the groove by inkjet printing technology to form the organic light emitting functional layer;

forming the second pixel electrode on a side of the organic light emitting functional layer away from the bottom of the groove.

Figure 8:
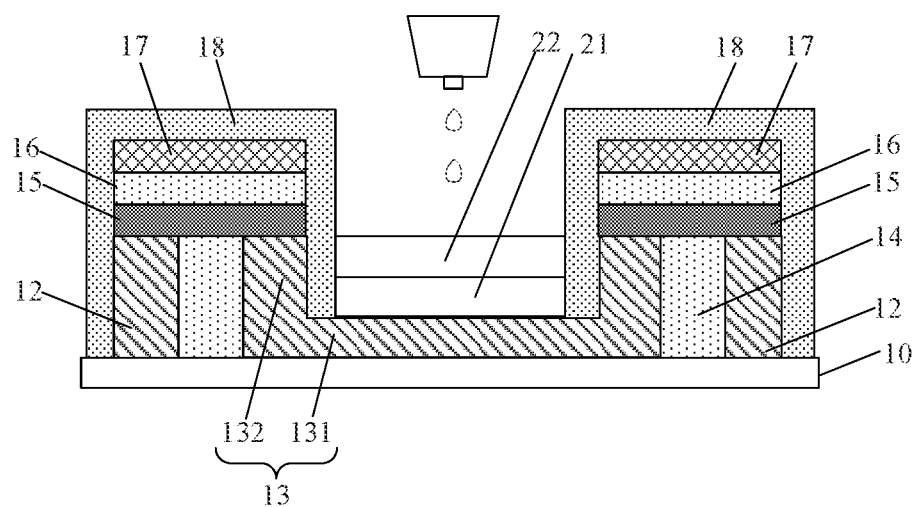
FIG. 8 is a cross sectional diagrams of an organic light emitting functional layer and a second pixel electrode arranged on the grooves according to an embodiment of the present disclosure.

Specifically, the above insulation film layer 18 may be of various types. Exemplarily, the insulation film layer 18 may be a passivation layer. Since the first portion 131 of the first electrode 13 of the thin film transistor corresponding to the light emitting unit can be exposed through the opening on the insulation film layer 18, and the first portion 131 of the first electrode 13 can be in contact with the light emitting unit to provide a driving signal for the light emitting unit, the first portion 131 of the first electrode 13 can be directly used as the first pixel electrode in the light emitting unit. In this way, when manufacturing the light emitting unit, the organic solution used to form the organic light emitting functional layer in the light emitting unit may be dropped into the groove by inkjet printing technology, so as to form the organic light emitting functional layer 21 on the first portion 131 of the first electrode 13; and then, the second pixel electrode 22 of the light emitting unit is manufactured on the side of the organic light emitting functional layer 21 away from the first portion 131 of the first electrode 13 to complete the manufacture of the light emitting unit, as shown in FIG. 8.

By using the first portion 131 of the first electrode 13 as the first pixel electrode of the light emitting unit as mentioned above, the manufacturing process flow of the light emitting unit is further simplified, and the manufacturing cost of the display substrate is reduced.

Figure 7:
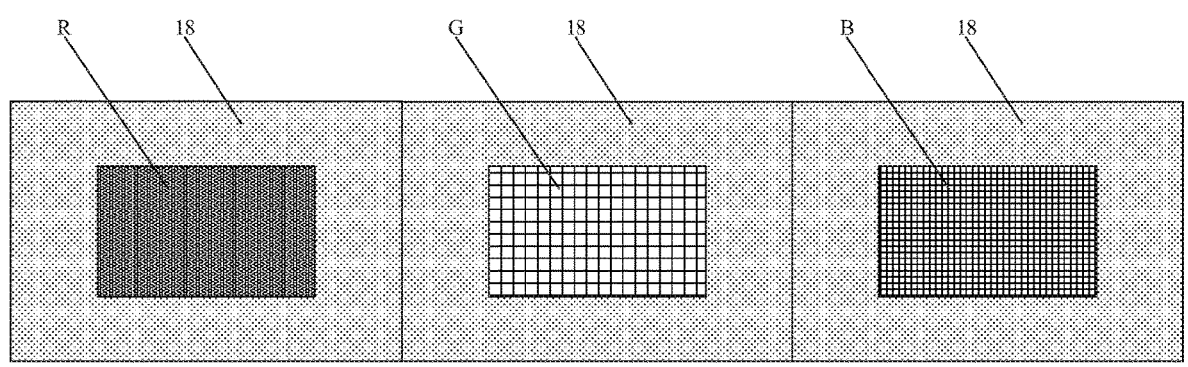
FIG. 7 is a top view of an RGB pixel unit according to an embodiment of the present disclosure.

More specifically, the top view of a structure of a red light emitting unit R, a green light emitting unit G, and a blue light emitting unit B manufactured by the manufacturing method provided in the above embodiment is shown in FIG. 7. Since the walls of the grooves are equivalent to the banks of the pixel definition layer in the related art, the spaces in the grooves are equivalent to the pixel opening regions defined by the pixel definition layer n the related art, so that when manufacturing the organic light emitting functional layers in the light emitting units, the organic light emitting functional layers can be formed in the grooves directly by inkjet printing technology, and there is no need to make an additional pixel definition layer to define the pixel regions used for manufacturing the light emitting units.

In some embodiments, the above step of manufacturing the second electrode 12 and the first electrode 13 in the thin film transistor includes:

manufacturing the second electrode 12 and the first electrode 13 by a single patterning process, in the direction perpendicular to the base substrate 10, the height of the second electrode 12 being equal to the height of the second portion 132 in the first electrode 13.

Specifically, first, a conductive film may be deposited on the base substrate 10. Then, photoresist is formed on the conductive film, and the photoresist is exposed using a half-tone mask to form a photoresist complete-reservation region, a photoresist half-reservation region, and a photoresist removal region, where the photoresist complete-reservation region corresponds to a region in which the second electrode 12 and the second portion 132 of the first electrode 13 are located, the photoresist half-reservation region corresponds to a region in which the first portion 131 of the first electrode 13 is located, and the photoresist removal region corresponds to a region other than the regions in which the second electrode 12, the first portion 131 and the second portion 132 of the first electrode 13 are located; the photoresist located in the photoresist removal region is completely removed by using developer, and the photoresist located in the photoresist half-reservation region is partially removed. Then the conductive film 11 located in the photoresist removal region is completely removed by an etching process. Subsequently, the photoresist is subjected to an ashing process so that the photoresist located in the photoresist half-reservation region is completely removed, and the photoresist located in the photoresist complete-reservation region is partially removed. Next, the conductive film located in the photoresist half-reservation region is partially removed by an etching process to form the first portion 131 of the first electrode 13. Finally, the photoresist located in the photoresist complete-reservation region is peeled off to form the second portion 132 of the first electrode 13 and the second electrode 12.

By manufacturing the second electrode 12 and the first electrode 13 by a single patterning process as mentioned above, the process flow is simplified effectively, and the manufacturing cost is reduced.

Furthermore, in the direction perpendicular to the base substrate 10, the height of the second electrode 12 is set to be equal to the height of the second portion 132 of the first electrode 13; and/or, the height of the first insulation pattern 14 is set to be equal to the height of the second portion 132 of the first electrode 13, which enables the active layer 15 formed above the three to have no step difference, that is, the surface of the active layer 15 used to form the second insulation pattern 16 is flatter, thereby making the second insulation 16 and the gate 17 formed above the active layer 15 have no step difference therebetween, which is more beneficial to the stability of the display substrate.

It should be noted that the embodiments in this specification are described in a progressive manner, and the same or similar parts between the embodiments can be referred to each other. Each embodiment focuses on the differences from other embodiments. In particular, for the method embodiments, since they are basically similar to the product embodiments, the description is relatively simple, and the relevant parts can be referred to the description of the product embodiments.

Unless otherwise defined, the technical or scientific terms used in the present disclosure shall have the usual meanings understood by those of ordinary skill in the art to which the present disclosure belongs. The terms "first", "second" and similar words used in the present disclosure do not indicate any order, quantity or importance, but are only used to distinguish different components. The word such as "comprising" or "including" or the like means that the element or object appearing before the word covers the elements or objects listed after the word and their equivalents, but does not exclude other elements or objects. The word "connecting" or "connected" or the like is not limited to physical or mechanical connection, but may include electrical connection, whether direct or indirect, Terms "Up", "down", "left", "right", etc. are only used to indicate the relative positional relationship. When the absolute position of the described object changes, the relative positional relationship may also change accordingly.

It will be appreciated that, when an element such as a layer, film, region, or substrate is referred to as being "on" or "under" another element, it can be "directly" on the other element, or there may be intermediate element(s).

In the description of the above embodiments, specific features, structures, materials, or characteristics may be combined in any suitable manner in any one or more embodiments or examples.

The above are only specific implementations of the present disclosure. However, the protective scope of the present disclosure is not limited thereto, and any changes or replacements easily conceivable by those skilled in the art within the technical scope disclosed in the present disclosure should be covered within the protective scope of the present disclosure. Therefore, the protective scope of the present disclosure should be defined by the protective scope of the claims.

The invention claimed is:

1. A display substrate, comprising:
    a base substrate,
    a thin film transistor array provided on the base substrate, the thin film transistor array comprising a plurality of thin film transistors, each thin film transistor comprising a first electrode and a second electrode, wherein the first electrode comprises a first portion and a second portion having a height difference therebetween, and wherein a height of the second portion is greater than a height of the first portion in a direction perpendicular to the base substrate,
    wherein each of the thin film transistors further comprises a first insulation pattern provided between the second portion of the first electrode and the second electrode, an orthographic projection of the first insulation pattern on the base substrate is located between an orthographic projection of the second electrode on the base substrate and an orthographic projection of the second portion of the first electrode on the base substrate,
    wherein the thin film transistor array is provided with a plurality of grooves for providing light emitting units, the first portion of the first electrode of each thin film transistor is located at the bottom of a groove, and a wall of the groove comprises the second portion of the first electrode of the thin film transistor,
    wherein the wall of the groove further comprises the second portion of the first electrode of a thin film transistor adjacent to the thin film transistor.

2. The display substrate according to claim 1, further comprising:
    an insulation film layer provided on a side of the thin film transistor array away from the base substrate, the insulation film layer comprising a plurality of openings corresponding to the plurality of grooves in one-to-one correspondence, each opening exposing the bottom of a corresponding groove;
    a plurality of light emitting units provided in the grooves in one-to-one correspondence, each light emitting unit being in contact with the bottom of a corresponding groove.

3. The display substrate according to claim 1, wherein the thin film transistor further comprises:
    an active layer on a side of the second electrode away from the base substrate, the active layer being in contact with the second electrode, the first insulation pattern and the second portion of the first electrode, respectively, an orthographic projection of the active layer on the base substrate surrounding an orthographic projection of the first portion of the first electrode on the base substrate;
    a second insulation pattern provided on a side of the active layer away from the base substrate, an orthographic projection of the second insulation pattern on the base substrate surrounding the orthographic projection of the first portion of the first electrode on the base substrate;
    a gate provided on a side of the second insulation pattern away from the base substrate, an orthographic projection of the gate on the base substrate being located within the orthographic projection of the second insulation pattern on the base substrate, and surrounding the orthographic projection of the first portion of the first electrode on the base substrate.

4. The display substrate according to claim 3, further comprising:
    an insulation film layer provided on a side of the thin film transistor array away from the base substrate, the insulation film layer covering the second portion of the first electrode, the active layer, the second insulation pattern and the gate, and the insulation film layer comprising a plurality of openings corresponding to the plurality of grooves in one-to-one correspondence, each opening exposing the bottom of a corresponding groove.

5. The display substrate according to claim 1, wherein each groove corresponds to two thin film transistors, the second portions of the first electrodes of the two thin film transistors are provided on opposite sides of the groove, respectively, and each thin film transistor further comprises:
an active layer on a side of the second electrode away from the base substrate, the active layer being in contact with the second electrode, the first insulation pattern and the second portion of the first electrode, respectively;
a second insulation pattern provided on a side of the active layer away from the base substrate;
a gate provided on a side of the second insulation pattern away from the base substrate, an orthographic projection of the gate on the base substrate being located within an orthographic projection of the second insulation pattern on the base substrate.

6. The display substrate according to claim 5, further comprising:
an insulation film layer provided on a side of the thin film transistor array away from the base substrate, the insulation film layer covering the second portion of the first electrode, the active layer, the second insulation pattern and the gate, and the insulation film layer comprising a plurality of openings corresponding to the plurality of grooves in one-to-one correspondence, each opening exposing the bottom of a corresponding groove.

7. The display substrate according to claim 6, wherein, the gates of the two thin film transistors are connected with each other, the second electrodes of the two thin film transistors are connected with each other, and the first electrodes of the two thin film transistors are connected with each other.

8. The display substrate according to claim 5,
wherein, the gates of the two thin film transistors are connected with each other, the second electrodes of the two thin film transistors are connected with each other, and the first electrodes of the two thin film transistors are connected with each other.

9. The display substrate according to claim 1, wherein a height of the second electrode is equal to the height of the second portion of the first electrode in the direction perpendicular to the base substrate; and/or,
a height of the first insulation pattern is equal to the height of the second portion of the first electrode in the direction perpendicular to the base substrate.

10. The display substrate according to claim 1, wherein one of the first and second electrodes of the thin film transistor is a source, and the other is a drain.

11. A display device comprising the display substrate according to claim 1.

12. A manufacturing method of a display substrate, comprising:
providing a base substrate;
manufacturing a thin film transistor array on the base substrate, the thin film transistor array comprising a plurality of thin film transistors, each of which comprising a first electrode and a second electrode, wherein the first electrode comprises a first portion and a second portion having a height difference therebetween, and wherein a height of the second portion is greater than a height of the first portion in a direction perpendicular to the base substrate,
wherein each of the thin film transistors further comprises a first insulation pattern provided between the second portion of the first electrode and the second electrode, an orthographic projection of the first insulation pattern on the base substrate is located between an orthographic projection of the second electrode on the base substrate and an orthographic projection of the second portion of the first electrode on the base substrate,
wherein the thin film transistor array is provided with a plurality of grooves for providing light emitting units, the first portion of the first electrode of each thin film transistor is located at the bottom of a groove, and a wall of the groove comprises the second portion of the first electrode of the thin film transistor,
wherein the wall of the groove further comprises the second portion of the first electrode of a thin film transistor adjacent to the thin film transistor.

13. The manufacturing method according to claim 12, further comprising:
manufacturing an insulation film layer on a side of the thin film transistor array away from the base substrate, the insulation film layer comprising a plurality of openings corresponding to the plurality of grooves in one-to-one correspondence, each opening exposing the bottom of a corresponding groove;
manufacturing a plurality of light emitting units in the grooves, the light emitting units corresponding to the grooves in one-to-one correspondence, each light emitting unit being in contact with the bottom of a corresponding groove.

14. The manufacturing method according to claim 13, wherein the insulation film layer comprises an inorganic layer, the light emitting unit comprises a first pixel electrode and a second pixel electrode opposite to each other, and an organic light emitting functional layer provided between the first pixel electrode and the second pixel electrode, and a bottom of the groove is used as the first pixel electrode of a corresponding light emitting unit;
the step of manufacturing the light emitting unit comprises:
printing organic solution in the groove by inkjet printing technology to form the organic light emitting functional layer;
forming the second pixel electrode on a side of the organic light emitting functional layer away from the bottom of the groove.

15. The manufacturing method according to claim 14, wherein the step of manufacturing the second electrode and the first electrode in the thin film transistor comprises:
manufacturing the second electrode and the first electrode by a single patterning process, a height of the second electrode being equal to a height of the second portion of the first electrode in the direction perpendicular to the base substrate.

16. The manufacturing method according to claim 13, wherein the step of manufacturing the second electrode and the first electrode in the thin film transistor comprises:
manufacturing the second electrode and the first electrode by a single patterning process, a height of the second electrode being equal to a height of the second portion of the first electrode in the direction perpendicular to the base substrate.

17. The manufacturing method according to claim 12, wherein the step of manufacturing the second electrode and the first electrode in the thin film transistor comprises:
manufacturing the second electrode and the first electrode by a single patterning process, a height of the second electrode being equal to a height of the second portion of the first electrode in the direction perpendicular to the base substrate.

18. A display substrate, comprising:
a base substrate,
a thin film transistor array provided on the base substrate, the thin film transistor array comprising a plurality of thin film transistors, each thin film transistor comprising a first electrode and a second electrode, wherein the first electrode comprises a first portion and a second portion having a height difference therebetween, and wherein a height of the second portion is greater than a height of the first portion in a direction perpendicular to the base substrate,
wherein each of the thin film transistors further comprises a first insulation pattern provided between the second portion of the first electrode and the second electrode, an orthographic projection of the first insulation pattern on the base substrate is located between an orthographic projection of the second electrode on the base substrate and an orthographic projection of the second portion of the first electrode on the base substrate,
wherein the thin film transistor array is provided with a plurality of grooves for providing light emitting units, the first portion of the first electrode of each thin film transistor is located at the bottom of a groove, and a wall of the groove comprises the second portion of the first electrode of the thin film transistor,
wherein the thin film transistor further comprises:
an active layer on a side of the second electrode away from the base substrate, the active layer being in contact with the second electrode, the first insulation pattern and the second portion of the first electrode, respectively, an orthographic projection of the active layer on the base substrate surrounding an orthographic projection of the first portion of the first electrode on the base substrate;
a second insulation pattern provided on a side of the active layer away from the base substrate, an orthographic projection of the second insulation pattern on the base substrate surrounding the orthographic projection of the first portion of the first electrode on the base substrate;
a gate provided on a side of the second insulation pattern away from the base substrate, an orthographic projection of the gate on the base substrate being located within the orthographic projection of the second insulation pattern on the base substrate, and surrounding the orthographic projection of the first portion of the first electrode on the base substrate.

* * * * *